US006822874B1

(12) United States Patent
Marler

(10) Patent No.: US 6,822,874 B1
(45) Date of Patent: Nov. 23, 2004

(54) MODULAR HIGH AVAILABILITY ELECTRONIC PRODUCT ARCHITECTURE WITH FLEXIBLE I/O

(75) Inventor: Bruce Marler, Morrison, CO (US)

(73) Assignee: Wooshcom Corporation, Morrison, CO (US)

( * ) Notice: Subject to any disclaimer, the term of this patent is extended or adjusted under 35 U.S.C. 154(b) by 7 days.

(21) Appl. No.: 10/291,111

(22) Filed: Nov. 12, 2002

(51) Int. Cl.[7] ................................................ H05K 5/06
(52) U.S. Cl. ...................... 361/752; 361/724; 361/818; 439/65; 439/61
(58) Field of Search ................................ 361/752, 724, 361/816, 714, 800, 297, 788, 803; 257/99; 385/24, 42; 439/65, 61

(56) References Cited

U.S. PATENT DOCUMENTS

| 4,573,753 | A |   | 3/1986  | Vogl             |        |
|-----------|---|---|---------|------------------|--------|
| 4,751,613 | A |   | 6/1988  | Werdin et al.    |        |
| 5,010,450 | A |   | 4/1991  | Werdin et al.    |        |
| 5,315,488 | A |   | 5/1994  | Le Gallo et al.  |        |
| 5,388,995 | A |   | 2/1995  | Rudy, Jr. et al. |        |
| 5,430,615 | A |   | 7/1995  | Keeth et al.     |        |
| 5,488,541 | A |   | 1/1996  | Mistry et al.    |        |
| 5,515,195 | A | * | 5/1996  | McAdams          | 385/42 |
| 5,685,741 | A |   | 11/1997 | Dewey et al.     |        |
| 5,708,563 | A |   | 1/1998  | Cranston, III et al. |    |
| 5,779,499 | A |   | 7/1998  | Sette et al.     |        |
| 5,822,184 | A |   | 10/1998 | Rabinovitz       |        |

(List continued on next page.)

OTHER PUBLICATIONS

Grass Valley Group (2000) 2000Series Frames Models 2000T1 and 2000T3, Instruction Manual.
Grass Valley Group (2000) 2000A89 8900 Module Adapter, Instruction Manual.
Grass Valley Group (2000) 2020DAC 4–Channel Audio D–toA Converter, Instruction Manual.
Grass Valley Group (2000) 2041RDA Wideband Rear Reclocking Districution Amplifier, Instructiohn Manual.

*Primary Examiner*—Randy W. Gibson
*Assistant Examiner*—Hung S. Bui
(74) *Attorney, Agent, or Firm*—Swanson & Bratschun, LLC

(57) ABSTRACT

A inexpensive and high-density modular I/O architecture is provided which accommodates both electrical and optical signals in high-availability configurations. By increasing the number of slots that can fit in a given chassis, a greater amount of functionality may be packed into a given piece of equipment, thereby saving facility space. The higher density also provides for a more cost effective overall solution as more circuit boards may be accommodated by the infrastructure of a single chassis. Furthermore, all active circuit modules are replaceable from the front of a chassis and all external I/O cable connections are made on its rear. These external cable connections need not be removed or touched when faulty circuitry is to be replaced. This makes faulty board replacement quick and convenient and eliminates confusion and possible incorrect reconnection of disconnected cables. It also eliminates signal interruption which would decrease equipment availability. A circuit module may be prevented from being inadvertently inserted in a slot with the incorrect type of I/O connections, thereby preventing the possibility of damaging either the circuitry on the circuit module or the circuitry within external equipment connected to the I/O connectors via the external cabling. I/O signals may be re-routed to redundant back-up circuitry in the event of a circuit fault and the faulty card may be replaced without interrupting the re-routed I/O signal, thereby yielding extremely high functional availability of the equipment. It easily accommodates not only 1-for-1 circuit redundancy, but also a much more cost effective 1-for-n redundancy. Redundancy may be provided for either electrical or optical I/O signals, thereby enabling the system to have high availability in a mixed signal environment.

22 Claims, 15 Drawing Sheets

U.S. PATENT DOCUMENTS

| | | |
|---|---|---|
| 5,912,801 A | 6/1999 | Roy et al. |
| 5,949,656 A * | 9/1999 | Pinault ................... 361/788 |
| 5,954,823 A * | 9/1999 | Cutts et al. ................ 714/14 |
| 6,144,561 A | 11/2000 | Cannella, Jr. et al. |
| 6,186,798 B1 | 2/2001 | Follingstad et al. |
| 6,195,493 B1 | 2/2001 | Bridges |
| 6,243,818 B1 * | 6/2001 | Schwan et al. ............. 713/300 |
| 6,270,262 B1 | 8/2001 | Hudgins et al. |
| 6,283,778 B1 | 9/2001 | Kupnicki et al. |
| 6,542,997 B1 * | 4/2003 | Rolls et al. ................. 713/324 |

* cited by examiner

MODULAR HIGH AVAILABILITY ELECTRONIC PRODUCT ARCHITECTURE WITH FLEXIBLE I/O

CROSS REFERENCE TO RELATED APPLICATIONS AND PATENTS

This application is related to the following U.S. Provisional patent application which is incorporated herein by reference: Ser. No. 60/337,557, filed Nov. 8, 2001.

TECHNICAL FIELD

This invention relates generally to the packaging of electrical systems and devices into a chassis and, specifically, to an improved modular arrangement of the printed circuit boards therein for enabling simple reconfiguration of input/out ("I/O") interface types and improved fault tolerance for both electrical and optical I/O signals.

BACKGROUND ART

Electronic devices, especially those used in communications systems such as cable head-ends and satellite uplink sites, are typically housed in chassis that are then mounted in vertical racks. In such systems, there is a need to provide I/O connectivity to various sources and destinations outside the device as well as to provide internal connectivity within the device. Furthermore, in devices that perform the function of switching, multiplexing, de-multiplexing, routing or other such similar functions, there is often the need to support multiple interfaces of the same type or of different types. These I/O types may be of either a conducted electrical signal or of an optically carried signal. In order to support multiple I/O interfaces of a variety of types, it has been the practice to divide a chassis into multiple identical slots, where each slot can be configured to support a variety of functions and interface types simply by changing the electronics module that occupies the slot. Each of the modules that contain active circuitry then typically needs to connect signals both to external I/O cables and also internally to other circuitry in the device.

Furthermore, it is desirable that such electronic devices provide high availability of service through fault tolerance and the ability to replace faulty circuitry without interrupting the operation of the device. These goals have typically been met by a) providing redundant circuitry that automatically takes over for circuitry that fails, and b) providing the capability to hot-swap faulty circuitry (that is to replace modules while the device is operational and without interrupting the processing of signals that connect to the device).

To make hot-swapping and cable management non-error prone, it has become common practice to construct these devices such that the circuit modules, which hold active circuitry, are replaceable from the front of a chassis while external I/O cabling is connected to the rear of the chassis. This makes it possible for cables to stay in place while faulty circuitry is replaced and eliminates the possibility of reconnecting cables incorrectly. It also eliminates the down-time that would be caused by the interruption of the flow of the signals on those cables while they are disconnected. Furthermore, it is desirable to provide some means to prevent a circuit module from being incorrectly installed in a slot where it would be connected to an inappropriate I/O type.

Existing devices may be categorized as follows:

a) I/O connection via mid-plane board to parallel connector PCB module;

b) I/O connection via perpendicular connector PCB module;

c) I/O connection via detachable connector faceplate.

FIG. 1 illustrates a device in which the mid-plane approach is employed. A circuit module 102 plugs in and out from the front of a chassis and has at least one right-angle connector along its back edge which mates with a corresponding connector 104 on a mid-plane printed circuit board 106. The mid-plane printed circuit board ("PCB") 106 typically extends across the full height of the chassis. Pairs of connectors 104,108 on opposite sides of the mid-plane PCB 106 are mounted in opposition to each other such that they can share pins that pass through the mid-plane PCB 106 to transmit all or some of the signals of the circuit module 102 directly through the mid-plane PCB 106 to a connector module 110. The connector module 110 then makes the connections to the external world using right angle mounted connectors 112 on its rear edge. There is no direct connection from the circuit module 102 to the connector module 110 in this approach.

The mid-plane approach for providing modular I/O connections has been standardized in IEEE 1101.11, wherein the connector modules are called "Rear Plug-in Units". U.S. Pat. Nos. 5,010,450, 5,315,488, 5,912,801, and 5,488,541 each describe variations of the mid-plane approach.

A disadvantage of the mid-plane approach is the extreme difficulty of making a blind-mateable fiber-optic I/O connection. If it was even realizable, it would be very complex as a blind-mateable optic I/O connection would require multiple fiber optic connections in the signal path between the active circuit module and the eventual external connector on the rear of the connector module. While U.S. Pat. No. 5,010,450 discloses a fiber-optic connection, the connection is not blind-mateable, but requires the physical removal of the cable from the circuit module before the circuit module can be fully removed.

A further disadvantage is that the thru connections from the active circuitry on the front circuit module to the rear connector module cannot be individually tailored with regard to impedance and other electrical characteristics. Rather, one must "make do" with the characteristics of the mid-plane pass-thru connector which cannot be arbitrarily reconfigured on a slot by slot basis.

A still further disadvantage is that a circuit module may inadvertently be inserted in the wrong slot causing the device to malfunction and possibly even destroying circuitry.

Finally, none of these patents present a solution for redundancy in which an I/O signal from a failed circuit module is automatically routed to a spare (backup) circuit module of the same type. Thus, in the event of a failure on a circuit module, the corresponding I/O will not be processed correctly until the faulty module is replaced.

Perpendicular Connector PCB Module

FIG. 2 illustrates a device in which the perpendicular connector PCB approach is employed. It is characterized by a direct connection between a circuit module 202, which contains active circuitry, and a connector module 210, which tailors the external I/O connectors 212 to a particular I/O type. However, the connector modules 210 are not co-planar with the circuit modules 202. Moreover, each connector module 210 is a fairly complex assembly typically involving at least two PCBs that are perpendicular to the circuit module 202, inter-board connections 214 and multiple stand-offs and spacers (not shown) (see U.S. Pat. No. 5,430,615 for an example). One PCB 216 directly behind the faceplate 218 holds the external I/O connectors 212 and another PCB 220 holds the connector which makes a direct connection to the circuit module 202. An additional board-to-board stacking connector 214 is used to transport signals between the two PCBs within the connector module 210. Two PCBs are typically required because the external I/O connectors 212 are generally thru-hole components and hence their protruding leads prevent another connector from being installed directly opposite on the backside of the PCB. By placing the stacking connector 214 off to the side, connectors can be mounted directly opposite one-another. Occasionally, when the slot density in the chassis is low, this approach can be implemented with one perpendicular PCB. However, the slot-to-slot pitch that can be achieved will thereby be limited, along with the density of the electronics. Furthermore, this approach has a high manufacturing cost.

U.S. Pat. No. 5,430,615 discloses a variation on this approach in that it does not include the inter-circuit module connectivity (i.e. cards in one slot cannot communicate to cards in other slots because there is no interconnect PCB which spans across slots). Furthermore the patent presents no solution for optical fiber signals or redundancy.

U.S. Pat. No. 6,144,561 discloses another variation on this approach in that it employs a full top-to-bottom mid-plane board in the chassis, and it connects each circuit module to its connector module via a dedicated hole in the mid-plane. This hole may present a problem: if the hole is not sufficiently large at initial design to accommodate all future connectors to be used, types or number of I/O signals in future modules may be limited. While this patent discloses a one-for-one redundancy method, it does not disclose any means for the much more efficient 1-for-n redundancy. Moreover, this patent fails to disclose how optical fiber I/O connections are achieved in such a way that would be apparent to one skilled in the art.

Neither patent discloses any method to prevent incorrect installation of a circuit module.

Detachable Connector Faceplate

FIG. 3 illustrates a device in which the detachable connector faceplate approach is employed. Internal connectivity is achieved via a back-plane board 306A or side-plane board 306B, and the external I/O connections are made by a direct connection from the circuit module 302 to pass-thru bulk-head mounted connectors 312 on the rear faceplate. In this approach there is no PCB in the connector module and herein lies the main disadvantage of this approach. Without a PCB, one is limited to special pass-thru connectors that have mating right-angle connectors that can be mounted to the circuit module. This class of connector is very rare and may only be available in the BNC type. D type and others are not generally available in a pass-thru configuration. Thus, this approach cannot easily support a wide variety of external connector types. Furthermore, without a PCB, it is not apparent how the external I/O signals can be routed to redundant back-up circuitry in such a way that the connectivity will be maintained while the active circuit module is replaced.

U.S. Pat. No. 6,283,778 discloses a side-plane version of this approach, with all the disadvantages described above. Additionally, it does not support optical fiber connections and does not prevent the circuit module from being inadvertently inserted in the incorrect slot. And, the rear circuit board (30b) of FIGS. 16 and 17 of U.S. Pat. No. 6,283,778 retracts with the circuit module (30a) as a single unit; thus, there is no printed circuit board that permanently resides at the rear of the chassis.

SUMMARY OF THE INVENTION

The present invention provides an internal architecture of a chassis product that is to be mounted in a vertical rack with other electronic chassis. The architecture is slot based and provides for multiple re-configurable input/output ("I/O") connector modules (with integrated co-planar printed circuit boards (PCBs)) in the rear of the chassis which provide all external cable connections. It also provides for the majority of the active circuitry to reside on circuit modules which may be easily accessed and replaced from the front of the chassis. Internal connectivity is provided by a mid-plane or side-plane board which makes connection between the internal modules.

Within each slot, a three-dimensional envelope is defined within which the rear I/O connector modules may make a direct connection to the circuit modules. This provides great flexibility for each circuit module to connector module connection to be custom designed and hence optimized for each type of I/O to be supported. Within this envelope, a co-planar connection is made between the circuit module's PCB and the PCB of the connector module to be used for electrical I/O signals. The connector module for electrical type signals then consists of a very simple single PCB with readily available right angle connectors on opposite edges, and a faceplate on the rear edge. Within this envelope optical I/O connections may also be made through fiber-optic connections on a connector module PCB or via a direct connection from a fiber-optic connector on the circuit module to a straight-thru fiber-optic adapter that is mounted on the rear faceplate. Again, the connector module remains quite simple, consisting of a smaller PCB for electrical connections and a simple off-the-shelf fiber-optic adapter mounted on the rear faceplate.

Each circuit module may be keyed directly to a corresponding mating connector module using a cylindrical plug and socket type key. The mating keying components reside on the PCBs of the circuit and connector modules and may pass through a hole in the mid-plane to mate with each other. The keying also aids in the alignment of the boards to one-another.

N+1 redundancy may be provided using ganged connector modules which occupy n+1 slots. These n+1 slot ganged connector modules are connected to one-another by an I/O inter-connection methodology that routes the n I/O signals to a slot containing a back-up circuit module. These ganged connector modules may be installed into the chassis as a single assembly with the I/O interconnection being an integral piece of it.

DETAILED DESCRIPTION OF THE PREFERRED EMBODIMENT

Figure 1:
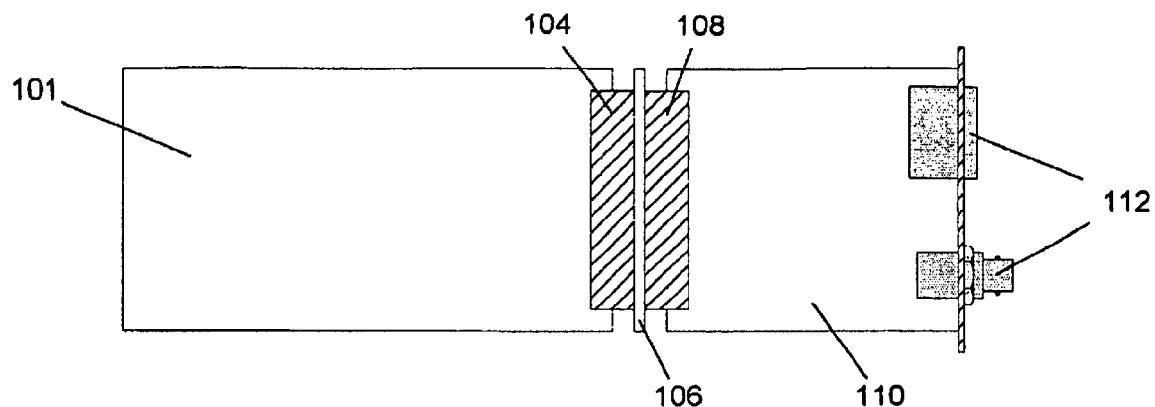
FIG. 1 illustrates a device of the prior art in which a mid-plane board is employed.
Figure 2:
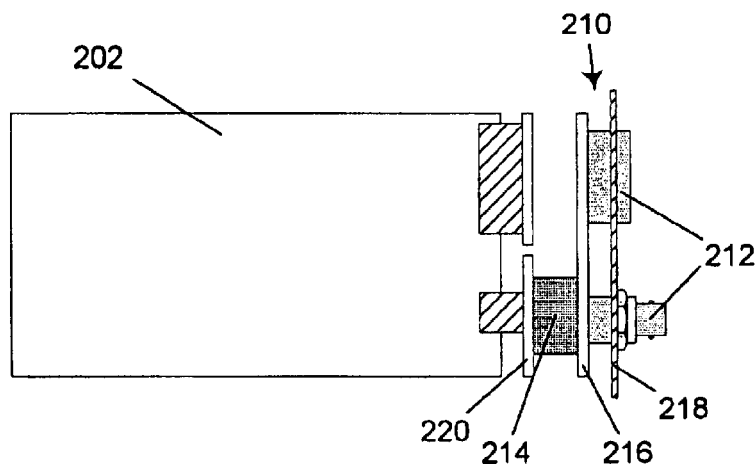
FIG. 2 illustrates a device of the prior art in which a perpendicular connector PCB module approach is employed.
Figure 3:
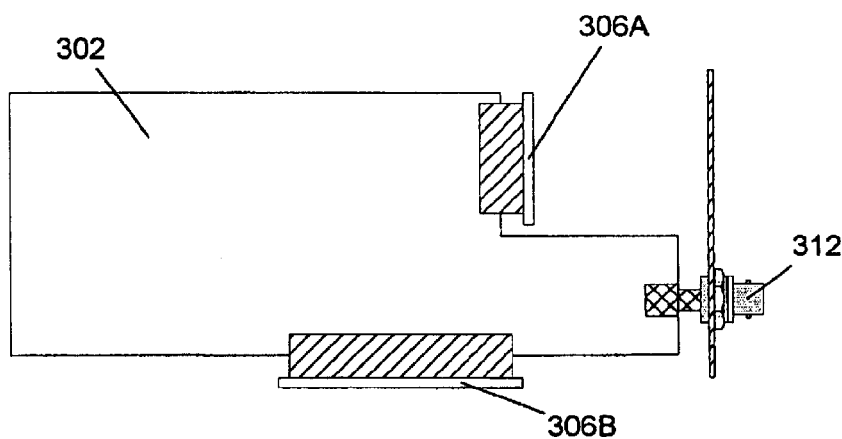
FIG. 3 illustrates a device of the prior art in which a detachable connector faceplate module approach is employed.
Figure 4:
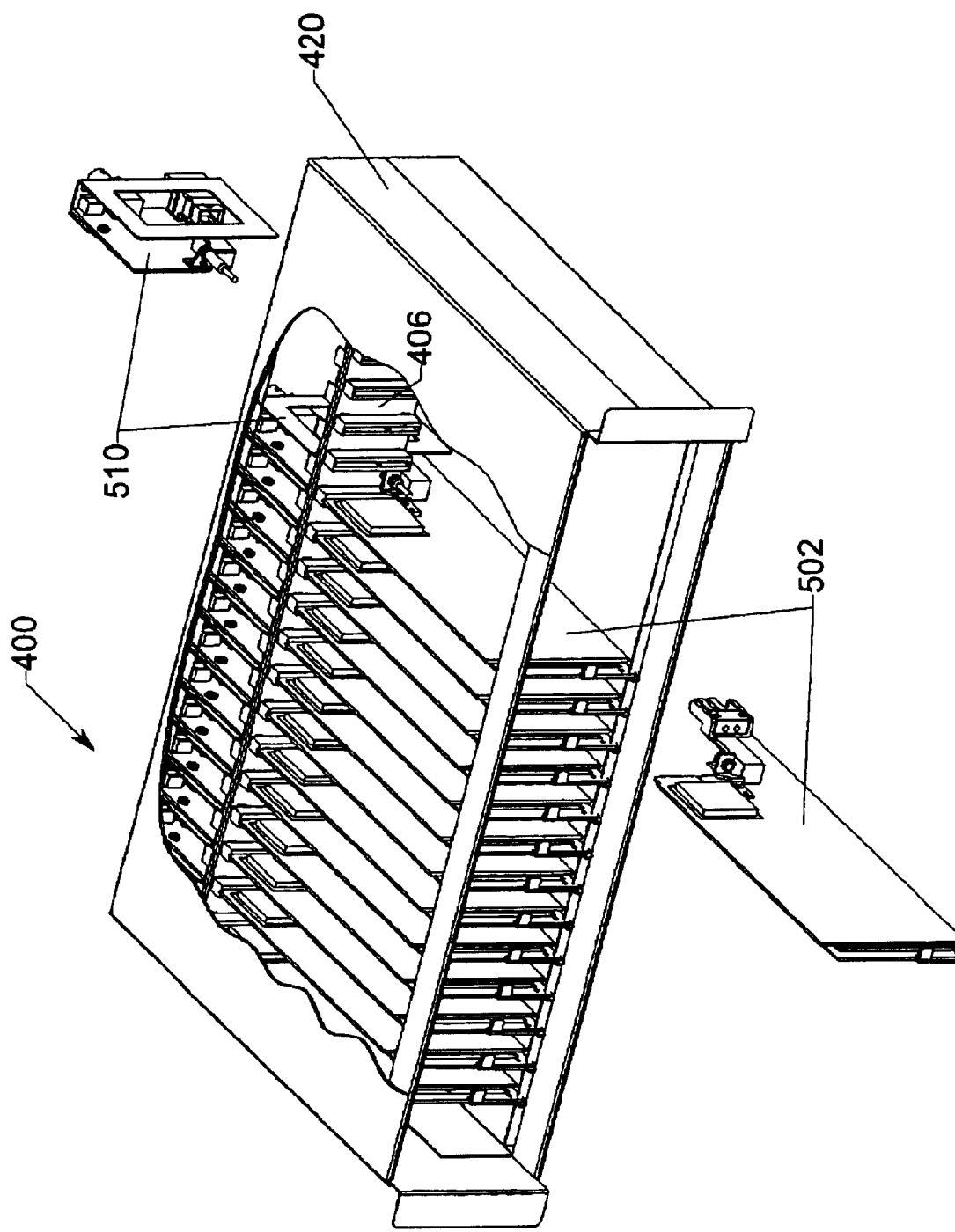
FIG. 4 illustrates a top-front cut-away perspective view of an embodiment of a chassis of the present invention with the circuit and connector modules oriented vertically.

FIG. 4 illustrates a top-front cut-away perspective view of an embodiment of a chassis 400 of the present invention with the circuit and connector modules oriented vertically. The chassis 400 consists of an outer shell, typically made of sheet metal, a front panel (not shown), a plurality of removable circuit modules 502, a plurality of removable connector modules 510, an internal power supply, a power entry module, fans and a mid-plane printed circuit board 406. Each circuit module 502 may slide on card guides and connect via a connector on a rear edge to a mating connector 504 on the mid-plane printed circuit board 406. All chassis I/O is handled by (i.e., passes through) the connector modules 510 to which electrical or optical cables to/from the outside world are connected. Circuit modules are removable from the front of the chassis 400, which may be open or have a hinged or articulating front panel to permit access. For each circuit module 502, there is a corresponding connector module 510 at the rear of the chassis 400 to which it mates as it is inserted. Therefore, the circuit modules 502 and connector modules 510 may be thought of as existing in pairs of corresponding mating modules. For flexibility, each connector module may be associated with various types of circuit modules.

Figure 5:
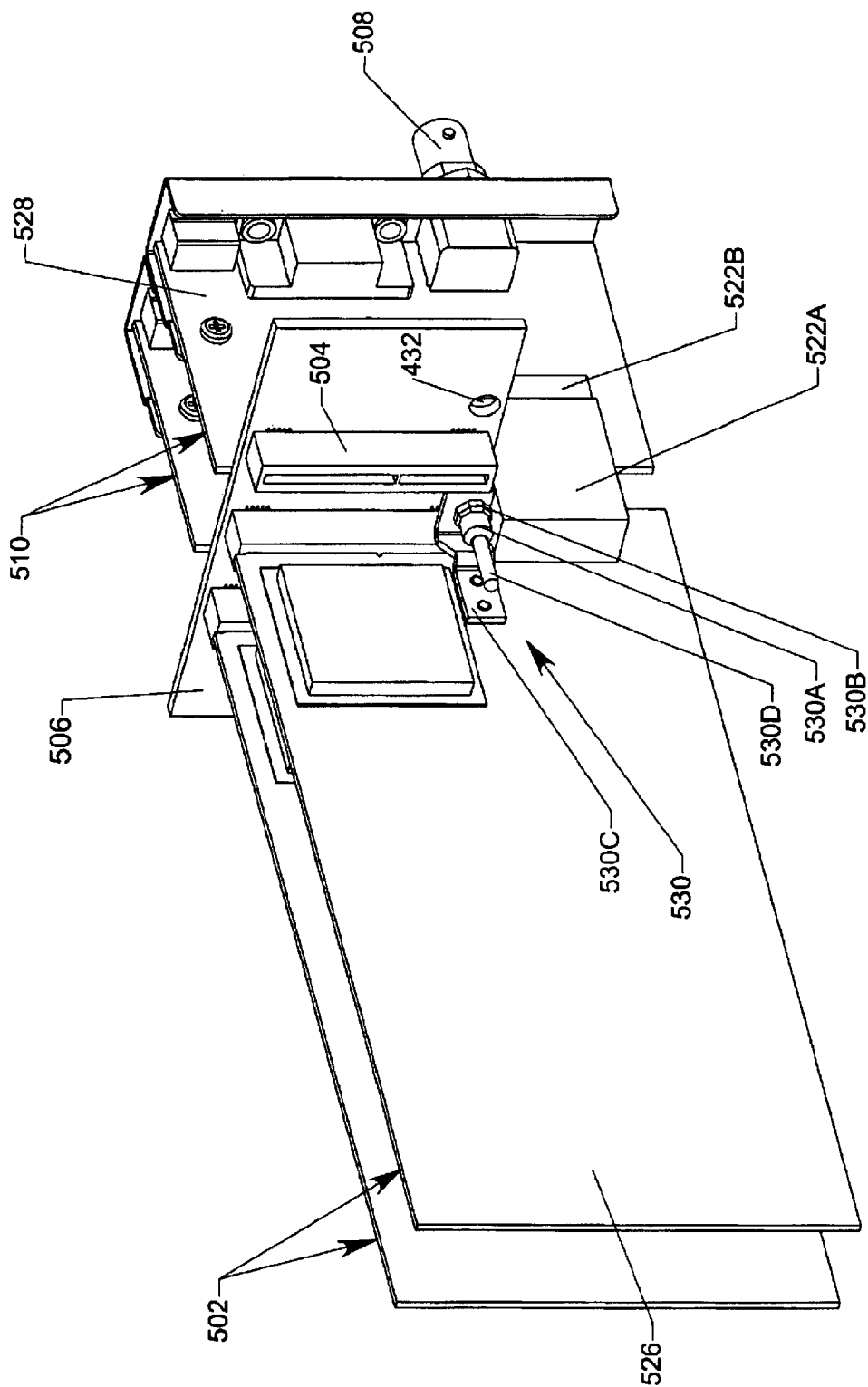
FIG. 5 illustrates the physical arrangement of the electrical circuit modules, the connector modules and the mid-plane board of FIG. 4.
Figure 6:
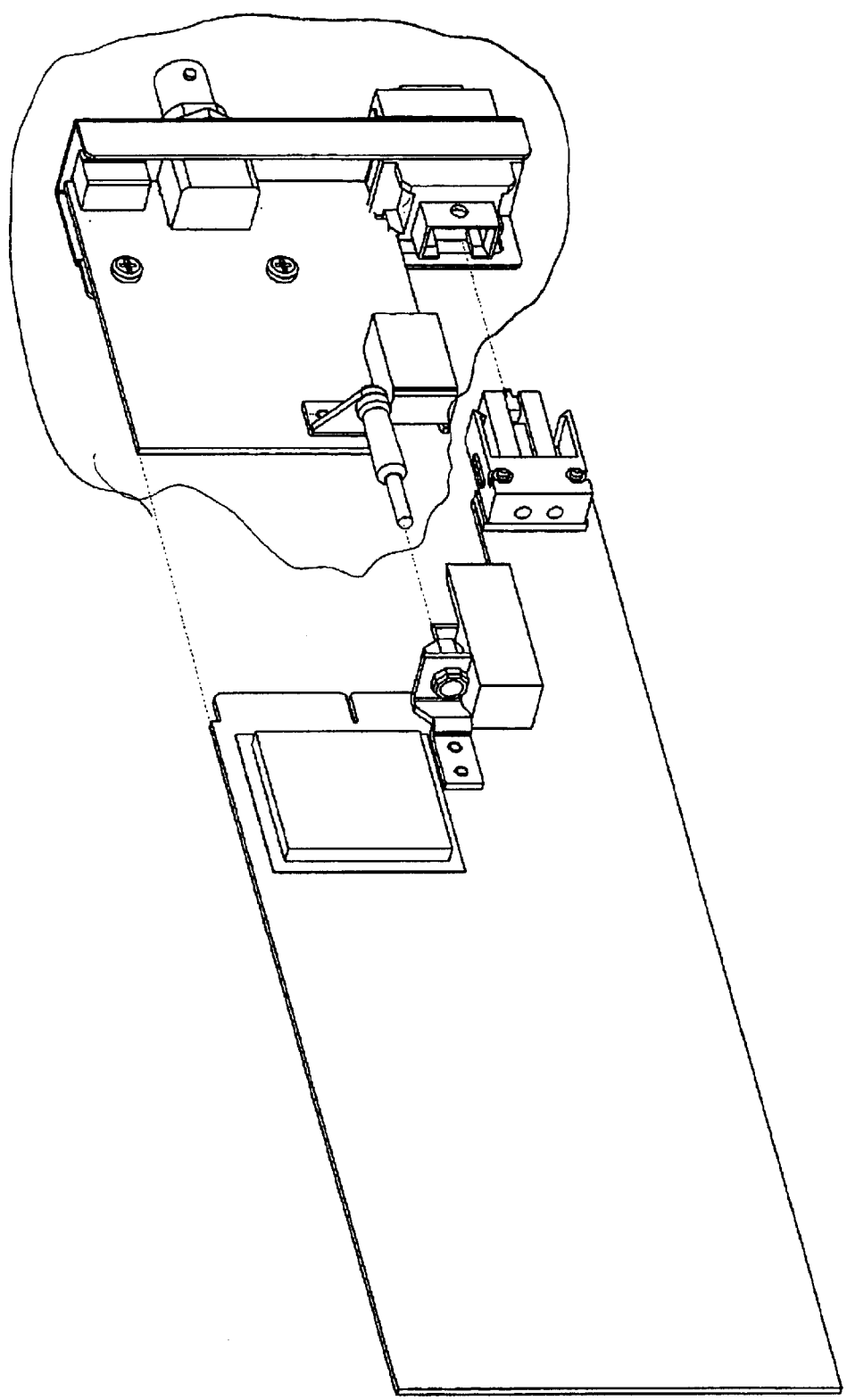
FIG. 6 illustrates a hybrid circuit module/connector module pair which employ an LC fiber optic connection.
Figure 7:
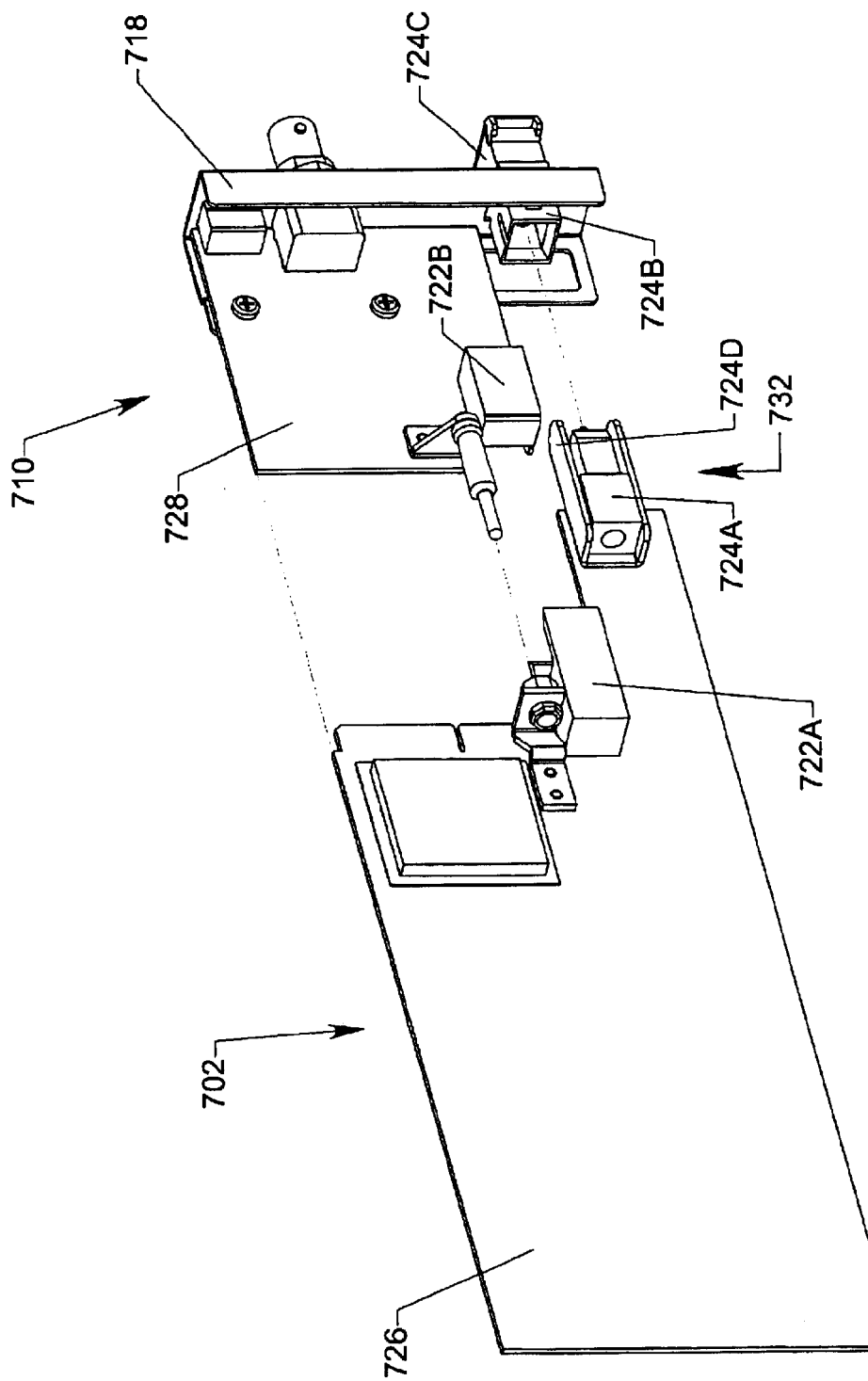
FIG. 7 illustrates a hybrid circuit module/connector module pair which employ an SC fiber optic connection.

Several different types of circuit modules and connector modules may be employed to support different types of electrical and optical fiber interfaces. Generally speaking the various types of modules may be put into one of three categories: a) electrical; b) fiber-optic; or c) hybrid (combination of both electrical & fiber-optic). FIG. 5 illustrates a perspective view of a pair of circuit modules 502, a pair of corresponding mating connector modules 510 and a portion of the mid-plane printed circuit board 506. The modules 502, 510 shown in FIG. 5 are interconnected by electrical connectors 522A and 522B. The mated pairs shown in FIGS. 6 & 7 are hybrid and are interconnected by both electrical connectors 722A, 722B and optical connectors 724A, 724B. Furthermore, the architecture may support circuit modules which perform internal processing and do not have I/O. For such modules, "blank" control modules with no I/O connections (except possibly ALARM connections) may be inserted in the rear. These blank control modules may have keying to permit only processing modules with no I/O to be installed. Lastly, the chassis may also include a dedicated slot for a control module. The control module may perform centralized control and management of all circuitry in the chassis and may also provide for remote control via I/O through its corresponding connector module.

Circuit Module & Connector Modules

The circuit module 502 illustrated in FIG. 5 slides in from the front of the chassis 400 and mates to a mid-plane printed circuit board 406 via the mid-plane connector 504. The circuit module 502, therefore, blind-mates into both the midplane connector 504 and the electrical connector 522B of the corresponding connector module 510. The circuit modules 502 are preferably hot-swappable; that is, they may be replaced with the power on and without adversely affecting the operation of the unit. The circuit modules 502 typically house the bulk of the active circuitry, whereas the connector modules 510 typically house only passive components such as I/O connectors to the outside world. Thus, the majority of active circuitry is included on modules that may be easily replaced from the front without any rear cables needing to be disconnected or even touched. The connector module 510 is also removable, but not hot-swappable. Rather, it is removable for the purpose of enabling chassis reconfiguration. The connector module 510 is replaced only after powering down the chassis 400 and following the appropriate procedures for replacement. The connector module 510 may or may not slide within chassis guides, depending on the type of the connector module. The mid-plane connection 504 provides internal connections for high-speed communication with other circuit modules within the chassis 400 and the electrical connection 522A provides external connections for communication with devices external to the chassis (i.e., the outside world).

The printed circuit board 526 of the circuit module 502 is co-planar with the PCB 528 of the connector module 510 and the two make direct connection to one-another. The connection between them is formed by a blind mate-able right angle connector 522A, 522B of opposite sex on each PCB, such as the Futurebus+, or 2 mm HM line of connectors. This connection may also be formed by an edge-to-straddle mount connection method using connectors such as those from the MEC1 line of products manufactured by SAMTEC of New Albany, Ind. Although not shown in FIG. 5, a connection from the connector module 510 to the mid-plane board 406 is required for redundancy as described below.

Signal Flow

The flow of signals is generally from the outside world to an external I/O connector 508 on the rear faceplate of a connector module 510, and then across the mainly passive connector module 510 through the electrical connector 522B, 522A to the corresponding circuit module 502. The signal is then processed by the active circuitry on the circuit module 502 and the result is communicated to other modules in the chassis 400 by flowing from the circuit module 502 to the mid-plane board 406 through the mid-plane connector 504 and then to other circuit modules via their mid-plane connectors. This flow is reversed for an output signal. Due to the large variety of right-angle PCB mount connectors on the market, virtually any type of I/O connection may be supported on the rear faceplate of the connector module 510, such as D-type, co-axial and terminal block connectors.

Keying & Guiding Mechanism

Also preferably connecting a circuit module 502 to its corresponding connector module 510 is a keying mechanism 530. The keying mechanism 530 prevents a circuit module from mating to any connector module except those with which it is intended to mate. Thus, circuit modules are keyed directly to corresponding connector modules and not to slots in the chassis 400 so that any slot in the chassis 400 may accommodate any type of circuit/connector module pair. In FIG. 5, the keying mechanism 530 may be seen to consist of a keying plug 530A that resides on the connector module 510 and a mating keying socket 530B that resides on the circuit module 502. It will be appreciated that the location of the plug 530A and socket 530B may be reversed. The keying components 530 may be the SIPAC/IEC coding accessories manufactured by Amp Incorporation under the base part numbers x-1393702-z and x-1393703-z. They have also been standardized as IEC 61076-4-102. The keying plug 530A and socket 530B may be mounted on brackets 530C (shown more clearly in FIG. 6), such as made from sheet metal, although they may also be made in several other ways. The brackets permit the guiding mechanism 530 to be raised off the surface of the PCBs 526, 528 a sufficient distance to permit the mechanism 530 to fit in-between the mid-plane connectors 504. From FIG. 5, it can be seen that the keying plug 530A goes through a hole 432 in the mid-plane board 406 before mating with the socket 530B. This hole 432 is positioned in-between adjacent mid-plane connectors 504. The keying plug 530A is mounted on a guide pin 530D and therefore provides an additional function of guiding the units together as they are being mated.

The hole 432 in the mid-plane board 406 may be sized such that it forms a very tight fit with the collar of the keying plug 530A. This may be used to align the connector module 510 to the mid-plane board 406 to within a desirable tolerance level and permits very fine pitch connectors to be used on the circuit module 502. Alternately, the hole 432 may be oversized and the connector module 510 permitted to "float". Either method helps prevent the mid-plane connector 504 and the electrical connector 522 from fighting each other when the circuit module 502 is inserted.

Fiber-optic I/O

FIGS. 6 and 7 illustrate the use of two types of fiber-optic connections. As can be seen from the Figs., the connector module's PCB 728 does not extend the full height of the chassis 400 in order to accommodate a direct optical connection from the circuit module 702 to an adapter on the rear faceplate 724B.

These direct connections may be made using two-piece blind-mate connection systems manufactured by such companies as Amp and Molex. The systems depicted in FIGS. 6 and 7 use, respectively, the BLC and BSC connectors from Molex. The two-piece BSC connection system is made-up of an adapter 724B that mounts directly on the rear faceplate 718 and a right-angle PCB mount fiber-optic connector 724A on the circuit module PCB 726 specifically designed to be blind-mated into the inner side of the adapter 724B. The outer side of the adapter 724C accepts a standard fiber-optic cable connector, an SC type in the case of the BSC system (FIG. 7) and an LC type in the case of the BLC system (FIG. 6). Other types are also available from various vendors. The external fiber-optic cable may remain connected to the adapter while the internal fiber-optic connection is mated or unmated. In some instances, a fiber-optic interconnection between the circuit module 702 and the adapter 724 may be made without the connector module 728 including a PCB 728. Nonetheless, the circuit module 702 and the connector module 710 are still deemed to be in a substantially co-planar relationship.

Because the fiber itself protrudes from right-angle PCB mount connectors in some cases, it should be protected from damage in the event that a circuit module is inadvertently plugged into the wrong chassis slot. The fiber shield 724D illustrated in FIG. 7 is such a protection scheme. The shield 724D protrudes sufficiently far so as to be the first item to hit should the circuit module 702 be inserted in the incorrect slot. But if it is inserted in the correct slot, the shield slides through slots in the rear faceplate 718 allowing the connection to be made. Care should be taken in the design of the interface between circuit modules 702 and connector modules 710 to ensure that the shield 724D will never be bypassed by any object. In the case of a slot with an electrical connector module, typically a rectangular female electrical connector, such as one from the Futurebus+ line, will reside in the space that the shield 724D will hit. In the case of a slot with a fiber-optic connector module 710, the keying system 732 will typically prevent the fiber from touching the adapter on an incorrect connector module.

Redundancy

The chassis 400 of the present invention may incorporate support for various redundancy approaches by the addition of secondary interconnections among a group of connector modules, thereby forming a set of ganged connector modules. The method may be used to provide a spare backup circuit module for each circuit module, called 1-for-1 redundancy. Or, the method may be used to provide a spare backup circuit module for any number, n, of other circuit modules, called n+1 redundancy. In the case of n+1 redundancy, when one of the n modules fails, the spare circuit module takes over for it. Because 1-for-1 redundancy is a subset of 1-for-n (or n+1) redundancy, only the n+1 redundancy scenario will be described.

Figure 8:
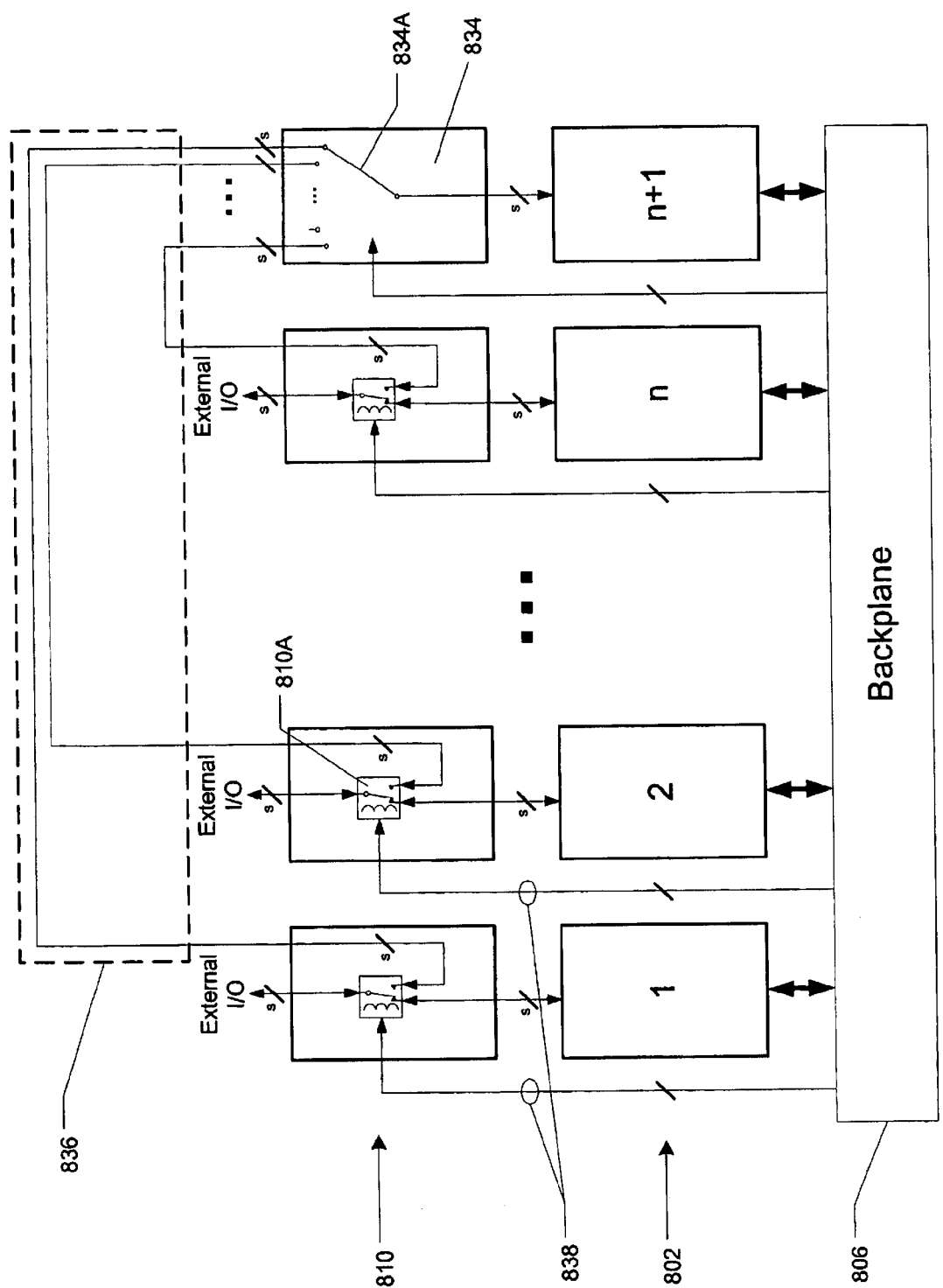
FIG. 8 schematically illustrates a star topology arrangement in which I/O signals from each of the n connector modules to be backed-up are individually routed via a secondary interconnect PCB to a spare slot.

One challenge in establishing redundancy is to route an I/O signal from a failed circuit module over to the n+1$^{st}$, or spare, circuit module. Topologically, there are two basic approaches, the star topology and the bused topology. FIG. 8 illustrates the star topology in which the I/O signals from each of the n connector modules 810 to be backed-up are individually routed via a secondary interconnect PCB 836 over to the spare slot, and a connector module 834 in the spare slot performs the function of selecting among the various signals using a switching device such as a multi-pole relay 834A. In FIG. 8, a relay 810A is shown as a switching device on each connector module 810; however, splitters or combiners may also be used in each connector module 810 at branch points to preserve the integrity of the signal by controlling the electrical characteristics of the signal's path. In normal operation, the relay 810A isolates the electrical characteristics of the path to the spare slot from the direct path into the mating circuit module 802. In the event of a failure, the relay 810A switches, thereby breaking the original path and forming a new path to the spare slot and again isolating the electrical characteristics of the two paths from one-another. In order to control the switching devices, switchover control signals 838 are needed and a direct connection is therefore provided from the primary interconnect PCB, such as the mid-plane board 806, to the connector modules 810. This connection permits the state of the relays 810A to be preserved when a faulty circuit module 802 is removed and replaced, as these switchover control signals 838 may be driven over the mid-plane board 806 by a control module (not shown) The control module is a single centralized board in the system for controlling overall system level functions. The newly replaced circuit module may then resume processing of the 110 signals in a carefully controlled manner. Signal integrity may also be maintained in other manners such as by matching impedances of the various path segments to one-another or by using combiners or splitters. Naturally, in the case of lower frequency signals where signal integrity is not crucial, the switching devices, splitters and combiners may be eliminated entirely.

Figure 9:
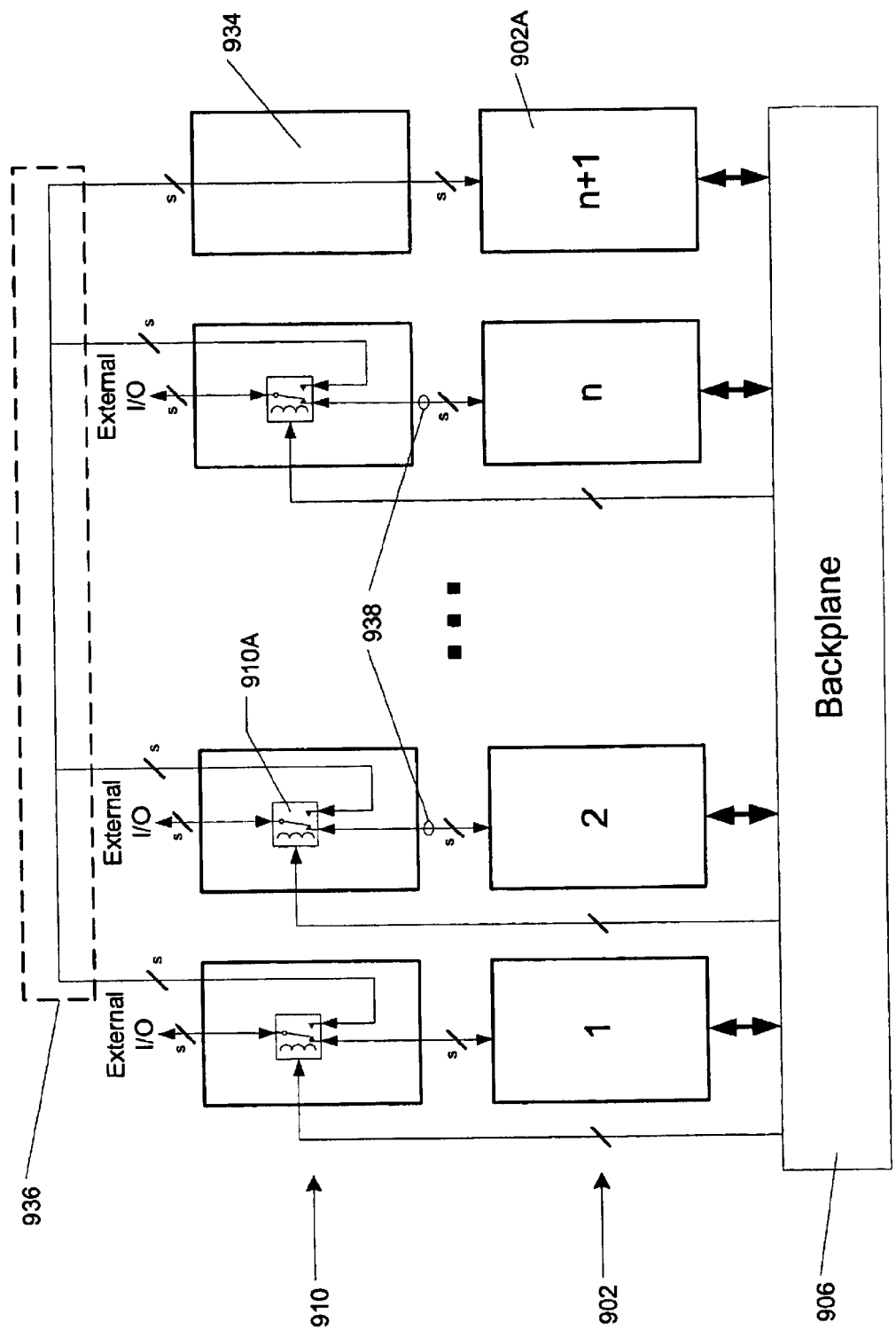
FIG. 9 schematically illustrates a bused topology arrangement in which I/O signals from each of the n connector modules to be backed-up are routed by a bus on a secondary interconnect PCB to a spare slot.

The bused topology is illustrated in FIG. 9. It is typically only appropriate for lower frequency signals where signal integrity is not crucial. The I/O signals from each of the n connector modules 910 to be backed-up are bused together over a secondary interconnect PCB 936 rather than being individually routed over to the spare connector module 934. The bus itself is then routed over to the spare connector module 934 and on to the spare n+1$^{th}$ circuit module 902A. No multipole relay is required on the spare connector module 934. However, each of the connector modules 910 should have some sort of switching device 910A to prevent signal contention on the bus. Only one slot may drive the bus at a time and typically only one slot would receive signals from the spare at any given time. As with the star topology, direct connections from the mid-plane PCB 906 to each connector module 910 are required to supply the switchover control signals 938.

For redundancy schemes to be supported, two additional sets of connections are required: a) direct PCB (such as mid-plane, back-plane or side-plane) to connector module connections and b) secondary signal interconnection between connector modules within a group that is implementing redundancy.

The direct mid-plane to connector module connection may be formed in one of two ways. In the first, mid-plane connectors from the 2 mm HM line made by many manufacturers such as AMP or FCI may be used. These mid-plane systems employ a male connector on the mid-plane with pins sticking out both sides of the mid-plane PCB. Female connectors are then used to simultaneously connect to either side. Such systems are described in the standard IEEE 1101.11. Alternately, surface mount connectors may be freely mounted on opposite sides of the mid-plane PCB. Because they are surface mount parts, they do not have any contacts or pins that go through the PCB and obstruct the mounting of a connector on the opposing side. Therefore freedom exists to mount two connectors directly opposite one-another on each side of the mid-plane PCB.

Of the many approaches for providing secondary interconnection between connector modules, two basic approaches are disclosed, i) PCB interconnection and ii) stacking connector. In both approaches, n+1 connector modules are interconnected to form a ganged assembly prior to being installed in the chassis. This ganged assembly is then installed in the chassis as a unit. It should be pointed out that only circuit modules with like I/O types should be grouped together in a ganged assembly for the purpose of providing redundancy. However multiple ganged assemblies of different types may be installed in the same chassis, limited only by available space in the chassis.

Figure 11:
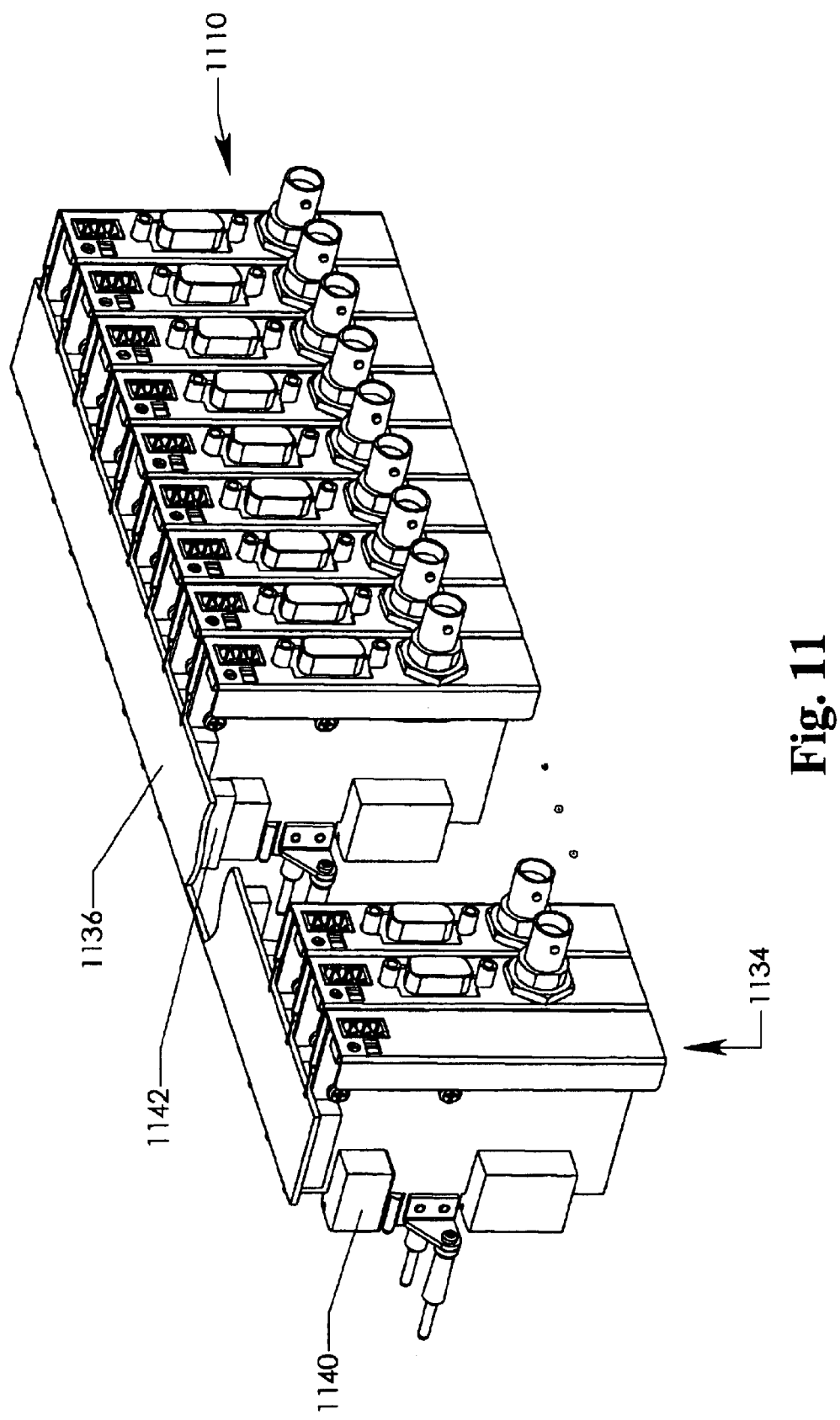
FIG. 11 illustrates a perspective view of an n+1 redundant ganged electrical connector assembly with a PCB Interconnect.

FIG. 11 illustrates a ganged assembly which implements secondary signal interconnections via a secondary PCB. This approach employs "n" connector modules 1110, each of the same I/O type, one spare connector module 1134, a secondary interconnect PCB 1136 and hardware fastening devices. To each connector module 1110, a direct mid-plane connector 1140 has been added to carry the switchover control signals from the mid-plane board. A switching device, combiner or splitter may also be present on the PCB (not shown) if the type of signal warrants it. Also shown are connectors 1142 to connect the connector modules 1110 to the secondary interconnect PCB 1136. The interconnect PCB 1136 is tailored specifically for the number of connector modules 1110 that are to be ganged together in the assembly and for the type and number of signals to be carried. The connector 1142 on the connector modules 1110 for the new PCB interconnection is shown on the top edge of the connector modules 1110, although any of the other edges could also be used. It may be a right-angle PCB mount connector or a PCB edge connection. The interconnect PCB 1110 may house the mate of another connector 1142 which may be of the straight PCB mount type. The ganged assembly may be formed by first mechanically securing the PCBs of the connector modules 1110 to one-another using male-female standoffs from companies such as RAF or using another scheme. This set of ganged connector modules 1110 may be inserted together into the interconnect PCB 1136 and then mounted in the chassis 400 and secured via each individual connector module's fastening method. The spare connector module 1134 is different from others in several ways. First, it has no external connections other than alarm connections for the purpose of indicating when a circuit module has failed. Second, its PCB is different by being configured to implement the particular topology circuitry selected. This approach may be used to implement either the bused or the star topology.

Figure 10:
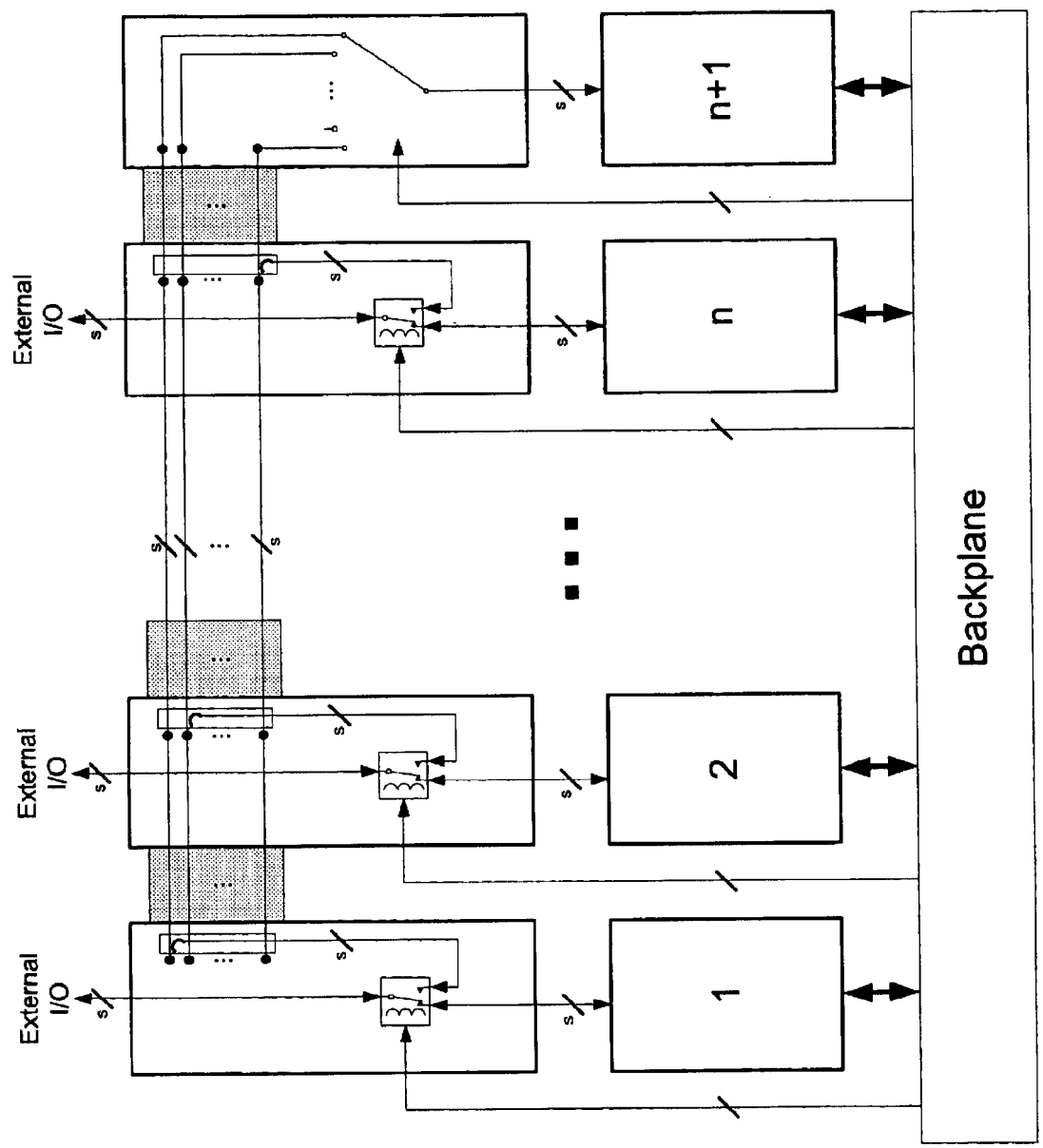
FIG. 10 schematically illustrates a bused topology arrangement in which stacked connectors are employed between adjacent connector modules.
Figure 12:
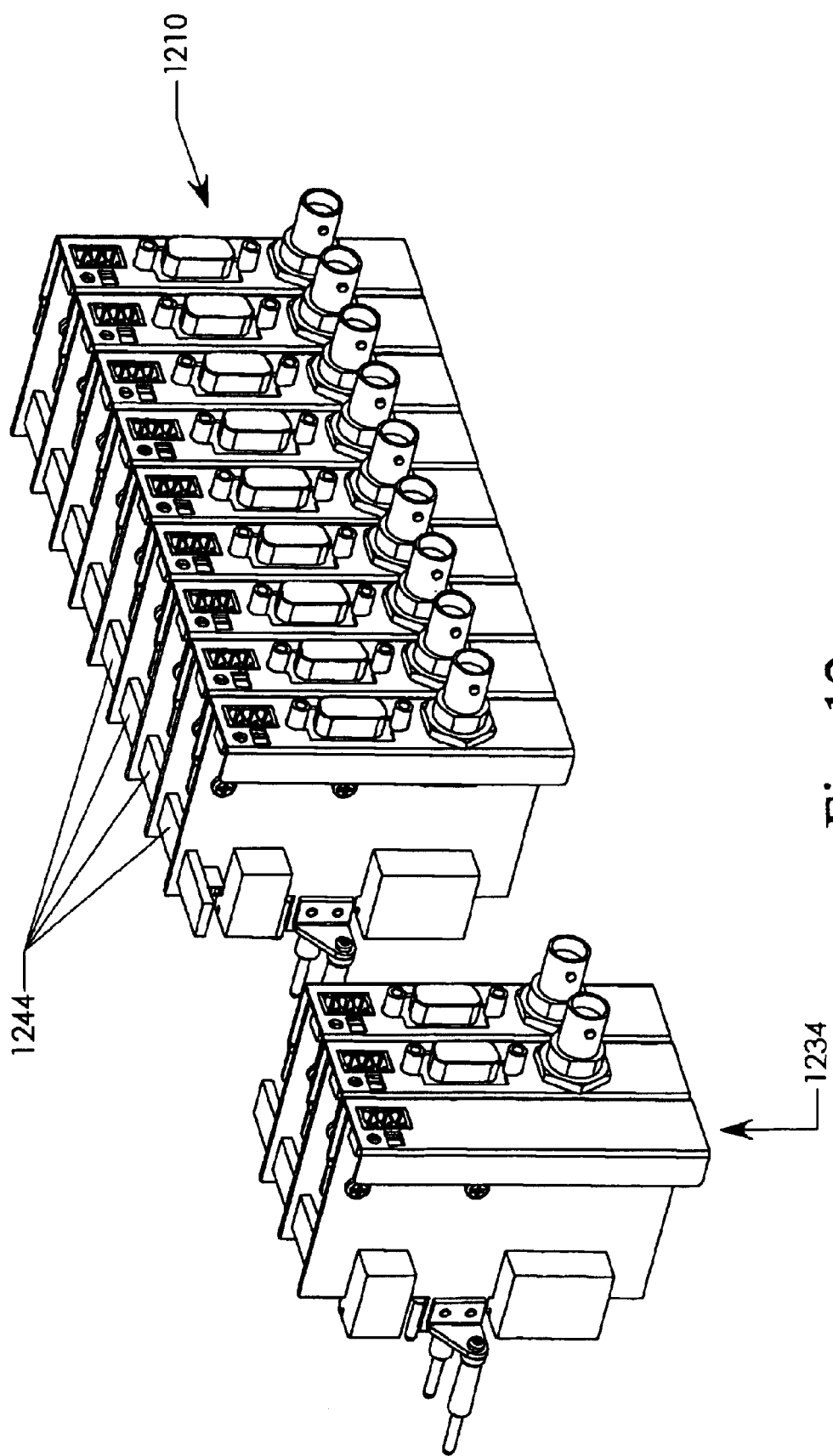
FIG. 12 illustrates a perspective view of an n+1 redundant ganged electrical connector assembly with stacking connectors.

FIGS. 10 and 12 illustrate an alternate embodiment of a method for forming the secondary signal interconnections between the connector modules 1210 in a ganged assembly. In this embodiment, the secondary signal interconnections are formed by a series of "n" board-to-board stacking connectors 1244. These connectors may be implemented in a number of ways. One of them is using SAMTEC's ESQ series of "Stackthrough" connectors. They come in a variety of contact counts and accommodate various board-to-board distances. Each connector module 1210 may optionally have an ESQ connector installed with the pins protruding from the bottom side and the elevated socket on the topside. The pins on the bottom side of a connector module may insert into the socket on the topside of the adjacent module. When the connector modules are not to be ganged, the stacking connector 1244 may be omitted.

The ganged assembly may be formed incrementally as before by first mechanically securing the PCBs of the connector modules 1210 to one-another using male-female standoffs. However as the modules are attached mechanically, the stacking connectors 1244 may also be mated, eventually yielding the complete ganged assembly. This ganged assembly may then be inserted in the chassis 400 and secured via each individual connector module's fastening method.

Figure 13:
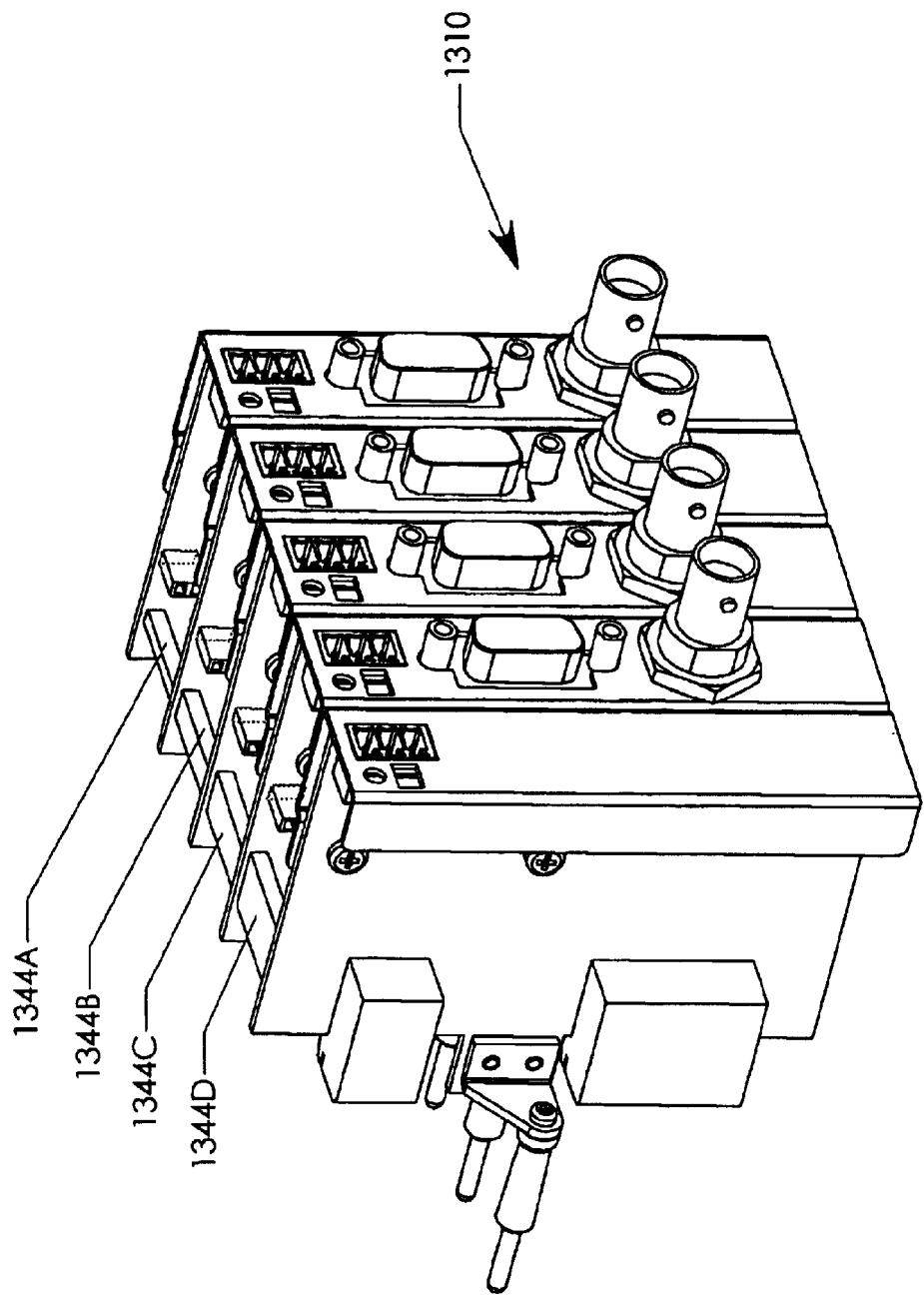
FIG. 13 illustrates a perspective view of an 4+1 redundant ganged electrical connector assembly with stacking connectors and jumper Blocks.

This approach naturally forms the connections necessary for the bus topology. However it may also be used to form the connections of the star topology by adding a jumper block to each connector module PCBs as depicted schematically in FIG. 10 and physically in FIG. 13 for the case of n=4. The jumper block may be implemented by standard jumper blocks that fit on headers, or by cutting the traces of unwanted signals on the PCB. Either method permits a dedicated connection to be formed from each connector module to the spare connector module. This connection may be for a single individual line or for several lines depending on what is required by the connector module. The stacking connectors may all have the same number of contacts or they may be staggered in size, starting at n×s where "s" is the number of signals per connector module, decreasing to (n−1)×s on the next module and eventually ending in a stacking connector to the last module with "s" signals. These staggered stacking connectors 1344A–C are shown in the embodiment of FIG. 13. By staggering the connections, unnecessary stubs can be eliminated thus improving the signal's quality and enabling higher frequency signals to be handled. FIG. 10 shows the star topology using stacking connectors of constant size. However, if one were to redraw it for staggered connectors, the stacking connector on the left would have size "s", and they would gradually increase in size as one moves towards the right increasing in size by "s" each time until the last connector on the right has a size of n×s.

Redundancy with Optical I/O

Figure 17:
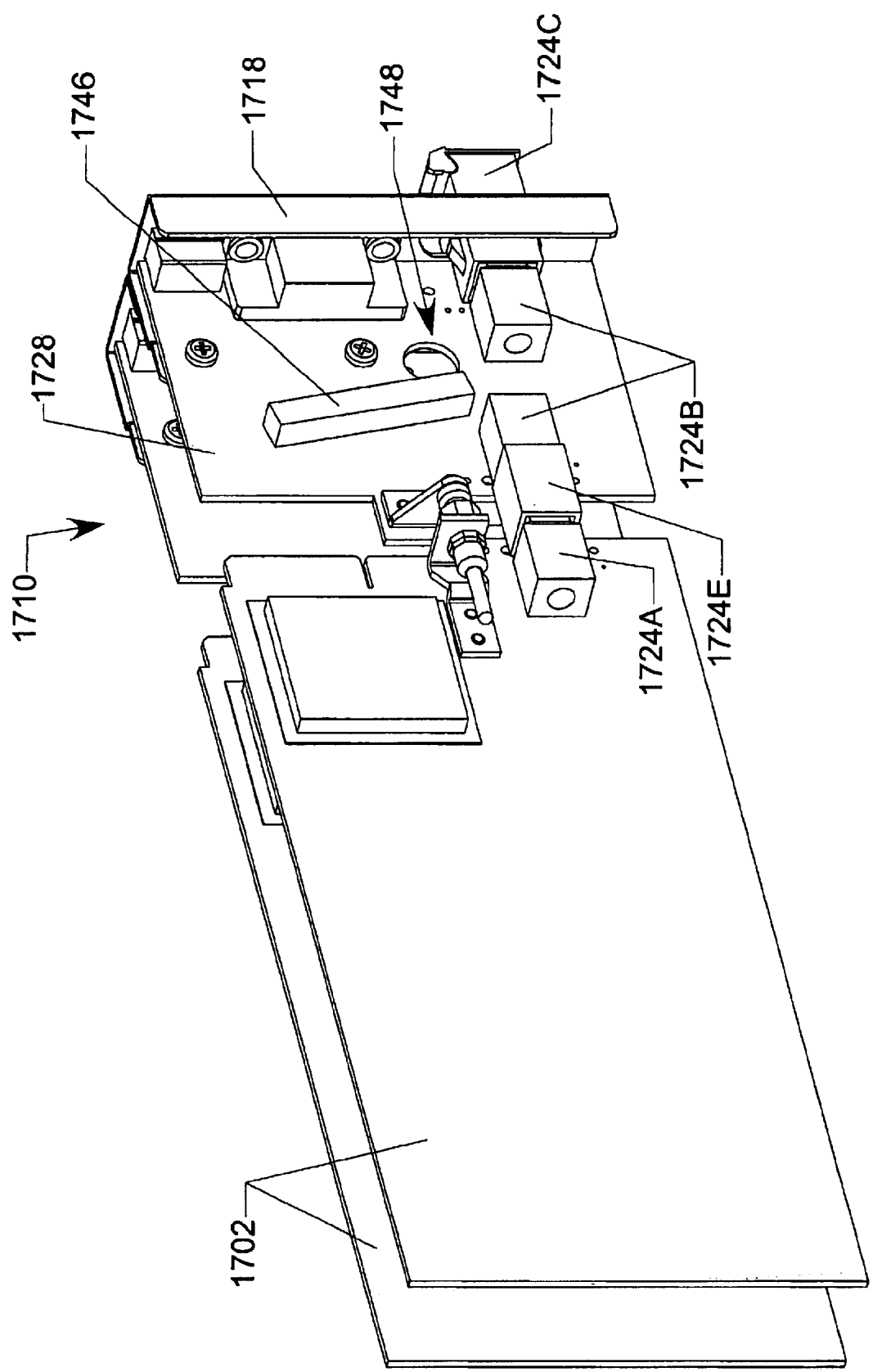
FIG. 17 illustrates a pair of redundant fiber optic modules of the present invention.

Redundancy with optical I/O is shown in FIG. 17 for the case of 1-for-1 redundancy. The case of n+1 redundancy is formed by replicating the primary connector module n times and placing an n-to-1 optical relay on the spare connector module. Redundancy is accomplished in a similar manner to electrical signals.

For optical redundancy using currently available connectors, the circuit modules 1702 may no longer be mated directly into adapters 1724B on the rear faceplate 1718 as was done in the non-redundant cases shown in FIGS. 6 and 7. Instead, the fiber-optic connectors 1724A on the circuit modules 1702 should now mate into corresponding fiber-optic connectors 1724B mounted on the connector module PCB 1728 via a blind-mate fiber optic adapter 1724E that is also part of the connector module 1710. On each connector module 1710, these fibers then connect to a coupler, splitter or optical relay 1746 that resides on the module 1710 (one of top splitter connections in FIG. 17). The fiber from the spare connector module goes through a hole 1748 in the PCB 1728 of the primary connector module 1710 to get to the coupler, splitter or optical relay 1746 on the primary connector module 1710 (the other top splitter connection in FIG. 17). The opposite side of the coupler, splitter or optical relay 1746 (bottom side in FIG. 17) then connects via an optical fiber to another fiber-optic connector 1724B that is plugged into a fiber-optic adapter 1724C on the rear faceplate 1718 of the primary connector module 1710 and thereby provides the connection to the outside world. Using this scheme, the star topology of FIG. 8 may be implemented.

Horizontally Oriented Chassis

Figure 14:
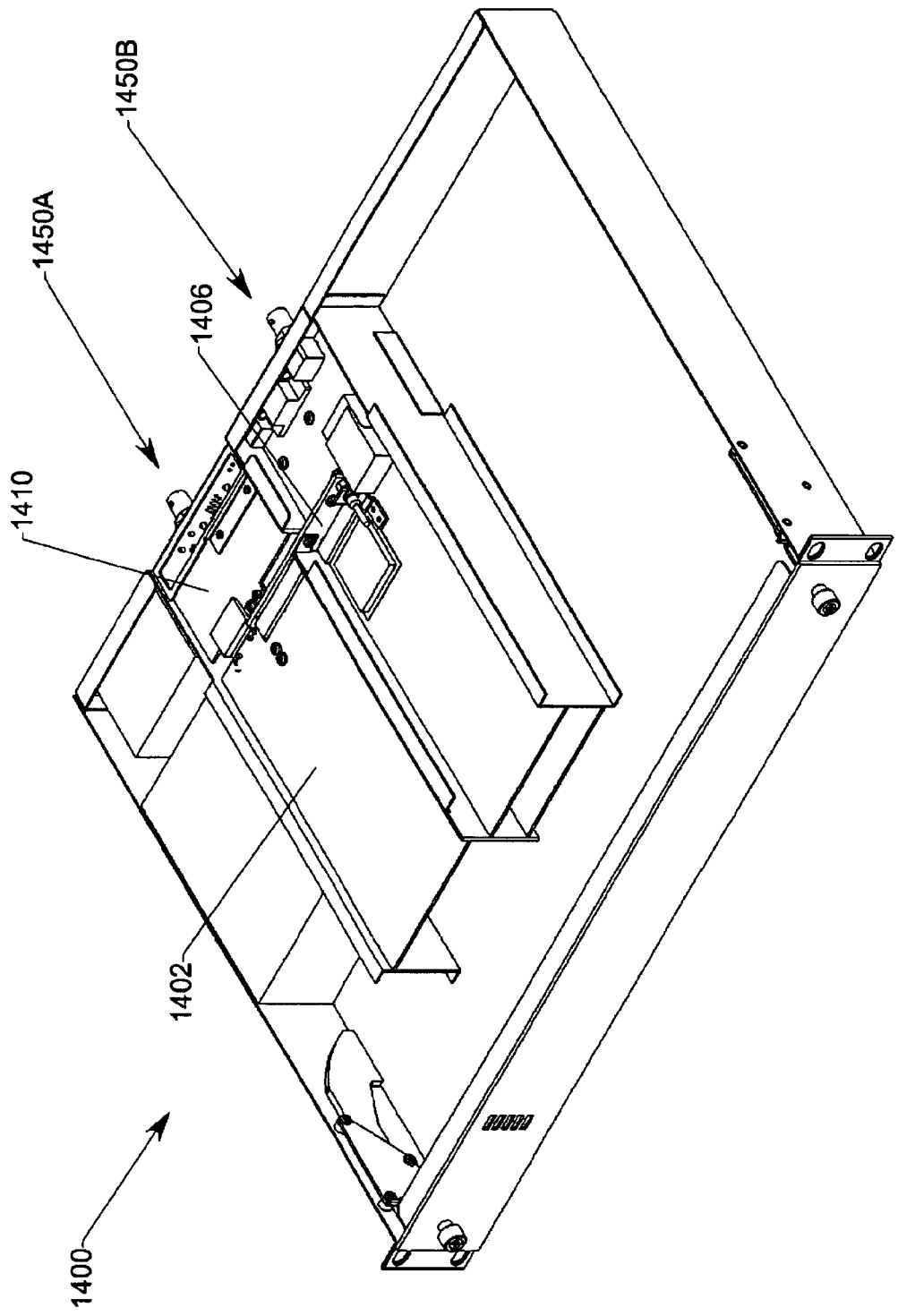
FIG. 14 illustrates an alternative embodiment employing a smaller chassis in which modules are mounted horizontally.

FIG. 14 illustrates a smaller chassis 1400 in which modules are mounted horizontally. The same circuit modules and connector modules may used as in the previously described embodiments. The circuit modules on side "A" 1450A are mirrored relative to the circuit modules on side "B" 1450B so that each circuit module's mid-plane connections adjoin one-another and permit a single mid-plane 1406 to exist in-between. In this embodiment, two horizontal slots exist on side "A" 1450A and two slots exist on side "B" 1450B with a four-slot mid-plane 1406 being centered along the vertical wall that separates the two sides. All slots except the lower slot on side "A" 1450A may accommodate a typical connector panel that supports I/O. However the lower slot on side "A" 1450A may only support processing circuit cards that have no I/O. Hence no connector module exists behind that slot but, rather, only the hardware required to present the appropriate keying. The space behind the lower slot A 1450A is used to bring power wiring and front panel cabling to and from the mid-plane 1406. One of the slots that supports I/O would be dedicated to a control module that would centrally control all boards in the chassis 1400.

The chassis 1400 also contains a power supply, a power entry module with an integrated switch, fuse and power receptacle. The front panel may be articulated, hinged or removable so that circuit modules can be accessed from the front, and it holds a printed circuit board with indicators. The front panel circuit board connects to the mid-plane 1406 via a ribbon cable (not shown) that passes along the left edge of the chassis and back through the cavity behind the lower part of side A 1450A.

Room is provided for four additional slots to be added in the chassis 1400 just to the right of the current slots in a similar manner. If these additional slots are added, the two mid-planes may be connected by another PCB that may be placed flush with the lower floor of the chassis 1400. For clarity, the additional four slots are not shown in FIG. 14.

Fully Redundant Chassis

Figure 15:
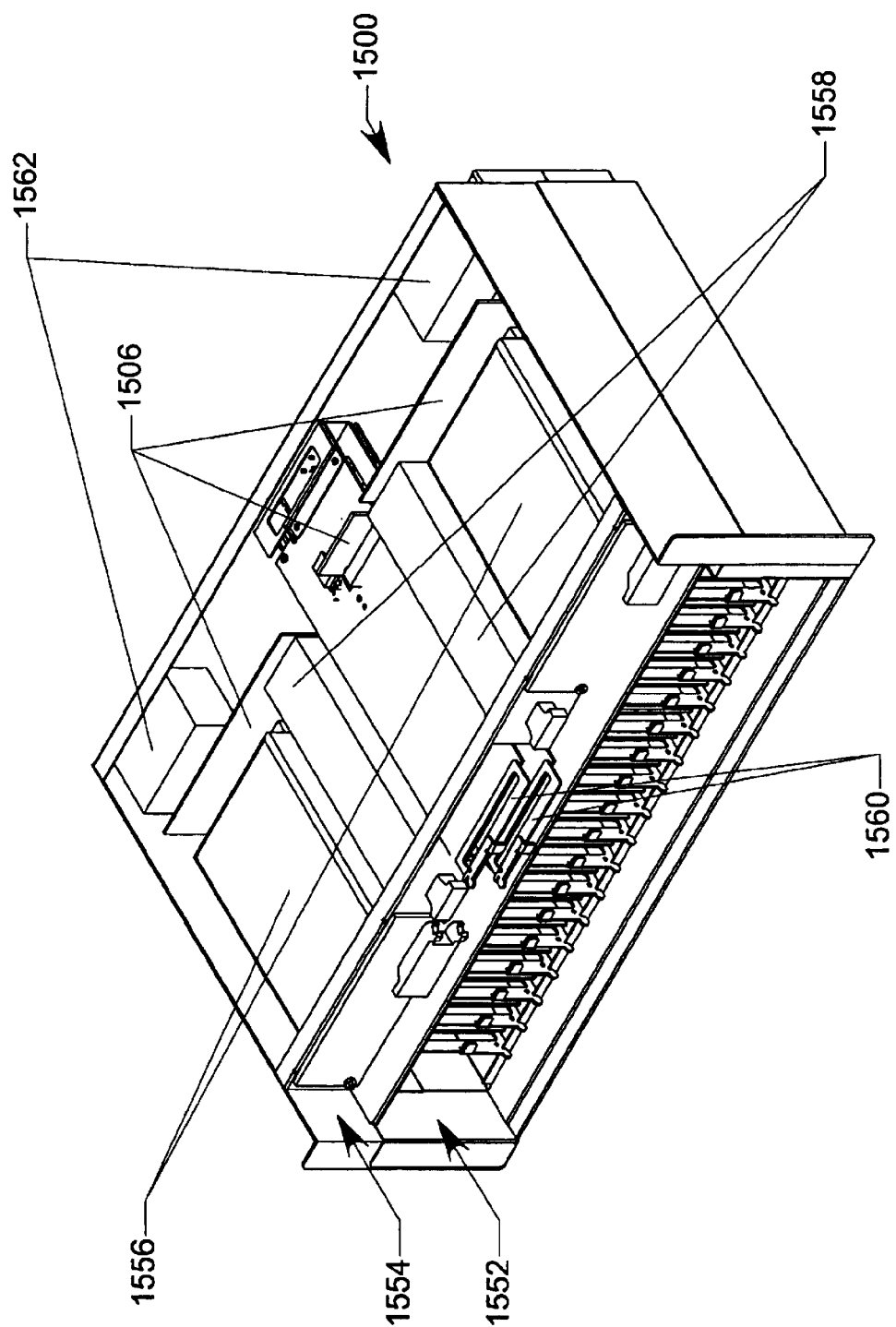
FIG. 15 illustrates another alternate embodiment employing a fully redundant chassis.

FIG. 15 illustrates a chassis configuration which provides maximum redundancy and hence availability. A bottom portion 1552 of the chassis 1500 contains a plurality of vertically oriented slots much like the embodiment of FIG. 4, except that there are no power modules or control modules present in this lower portion. Each of these lower slots is general purpose in nature and may therefore accommodate any type circuit/connector module pair except for the control module type. Above the bottom section 1552 is an upper section 1554 that contains two redundant hot-swappable power modules 1556, two redundant hot-swappable fan modules 1558, and two redundant control modules 1560 mounted in a horizontal orientation. In this same upper section 1554, but at the rear of the chassis 1500, are two hot-swappable power entry modules 1562. Each power entry module 1562 supplies AC power to one of the power modules 1556, and each has its own AC receptacle. In the event of the failure of one of the power entry modules 1562, or one of the power modules 1556, or the loss of one of the AC power sources, the alternate power entry module, AC power source and power module would power the entire chassis. The front panel (not shown) is open, hinged or articulating to permit access to all of the various modules.

The power modules 1556 and the mid-plane connections comply with the CompactPCI Power Interface Specification PICMG 2.11 R1.0. The power modules 1556 may be manufactured by such firms as Condor DC Power Supplies, Inc. in Oxnard, Calif. under part number CPCI-204-1203. The power entry modules 1562 blind mate into connectors, such as those manufactured by Positronic Industries Inc. of Springfield, Mo. under part number PCIH47F300A1-246.0. These connectors provide AC power to the power modules 1556 and distribute DC power and other signals through the mid-plane board 1506. The AC power flows from spade lug connections on each power entry module 1562 via discrete wires to crimp contacts that fit in from the rear of the Positronic connectors to form AC pass-through connections to the mated power modules 1556.

The fan modules 1558 run off DC power that is supplied via floating blind-mateable connectors that reside on the mid-plane board 1506. The fan modules 1558 may contain several fans enclosed within an enclosure with discrete wiring carrying power from the connector at the rear of the module's enclosure to each fan. Temperature, tachometer and other signals may also be routed across the connectors from the fans through the mid-plane board 1506 to the control modules 1560 to enable monitoring of the fan modules 1558.

The two horizontal slots in the top portion are intended to accommodate two redundant control modules 1560. These control modules 1560 can have I/O signals that pass to the outside world via their mating connector modules at the rear of each of their respective slots for the purpose of providing remote control and monitoring of the device.

Chassis with Side-plane

Figure 16:
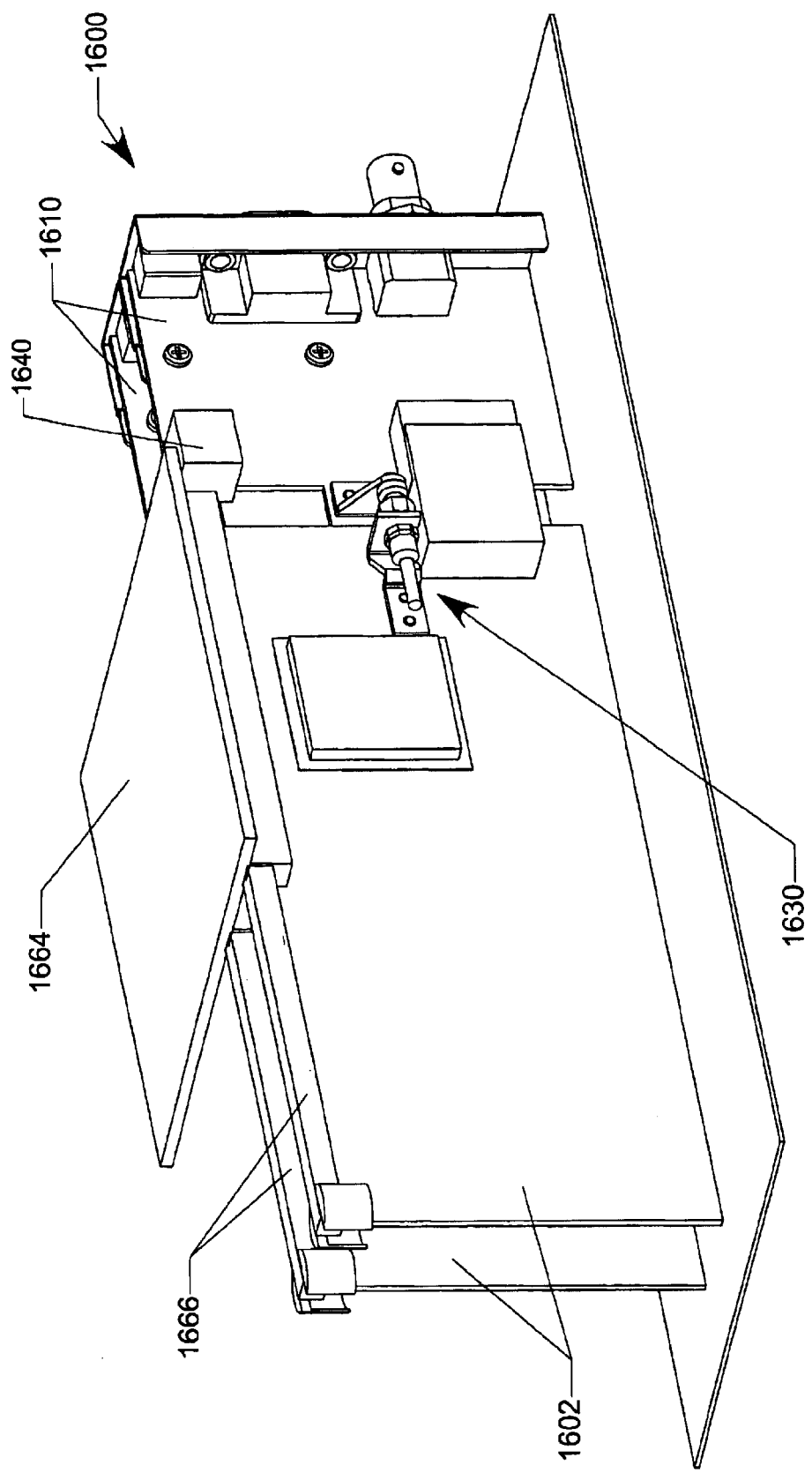
FIG. 16 illustrates still another embodiment in which a side-plane is employed for mounting the modules.

In the chassis 1600 illustrated in FIG. 16, the internal connectivity is implemented with a side-plane 1664 on the upper side of the chassis 1600. This has the advantage of decoupling the I/O space from the size of the mid-plane and hence the number of signals that may be used for inter-board communication. More room is available for I/O connections to the rear connector module 1610 from the circuit module 1602, and more room is available for inter-board communication because the plane that is now used for inter-board communication is a previously unused plane which does not interfere with the plane which is used for I/O connections. The larger number of permissible inter-board communication signals thereby enables higher bandwidth communication between circuit modules.

The releasable connectors 1666 shown in FIG. 16 are described in U.S. Pat. No. #6,283,778, but may be of some other type. In the present invention, the connector module 1610 is a separate board from the circuit module 1602 and remains at the rear of the chassis 1600 when the circuit module 1602 is un-plugged.

The inter-board communication takes place on the side-plane PCB 1664, which is shown in FIG. 16 as being on the topside of the chassis 1600, although it could just as easily be mounted on the bottom. To this side-plane PCB 1664 are mounted the releasable connectors 1666 that make contact with the circuit modules 1602 at the top rear edge of those boards. Preferably, the releasable connector 1666 has a knob or comparable device at the front edge which, when turned, releases the contacts of the connector and permits the board to be removed with the power on. The circuit module 1602 may directly connect to the connector module 1610 as in the previously described embodiments except that now there is more room for the electrical or optical connections between the two. The same keying mechanism 1630 may be employed, although now it will no longer pass through a mid-plane hole.

Switchover control signals may be brought from the side-plane PCB 1664 to the connector module 1610 via a direct side-plane connector 1640. This may be implemented with a right angle connector on the side-plane of one polarity and a right angle connector of the opposite polarity on the connector module 1610. Part numbers TSW-103-08-G-T-RA and SSW-103-02-G-T-RA are right angle mating connectors manufactured by Samtec of New Albany, Ind. which may be used for this connection. This part includes nine contact connectors arranged in a symmetrical 3×3 matrix pattern. Because the pitch of the contacts in both axes is the same, the connectors may be rotated by 90° with respect to one-another and still be mated. Alternately, switchover control signals may be transported to the connector modules 1610 using a smaller version of the releasable connector 1666 with the release knob located at the rear of the chassis (not shown).

As with the embodiment of FIG. 4, the connector modules 1610 may be ganged together for purpose of implementing redundancy.

The objects of the invention have been fully realized through the embodiments disclosed herein. Those skilled in the art will appreciate that the various aspects of the invention may be achieved through different embodiments without departing from the essential function of the invention. The particular embodiments are illustrative and not meant to limit the scope of the invention as set forth in the following claims.

What is claimed is:

1. A chassis for receiving circuit modules, comprising:
   a primary interconnect board; and
   a plurality of first connectors affixed to the primary interconnect board, each first connector for receiving a circuit module and being positioned on the primary interconnect board to permit the circuit module to be directly mateable with a corresponding connector module in a substantially co-planar relationship, whereby the connector module and the circuit module are independently removable from the chassis.

2. The chassis of claim 1, further comprising means for redundancy.

3. The chassis of claim 2, wherein one of the first connectors is for receiving a spare circuit module, the means for redundancy comprising:
   a plurality of second connectors affixed to the primary interconnect board, each second connector for receiving a connector module and being positioned on the primary interconnect board to permit the connector module to be mateable with a corresponding circuit module in a substantially co-planar relationship; and;
   means for directing the connector module, mated to a faulty corresponding circuit module, to couple an I/O signal to the spare circuit module.

4. The chassis of claim 3, the means for redundancy further comprising a plurality of stacking connectors for interconnecting a connector module with an adjacent connector module.

5. The chassis of claim 3, wherein, one of the second connectors is for receiving a spare connector module, the means for redundancy further comprising a secondary interconnect board for interconnecting I/O signals between at least one connector module and the spare connector module.

6. The chassis of claim 5, wherein the circuit module and the connector module are mateable with a fiber optic connector.

7. The chassis of claim 5, wherein the circuit module and the connector module are mateable with an electrical connector.

8. The chassis of claim 5, wherein the circuit module and the connector module are mateable with a fiber optic connector and an electrical connector.

9. The chassis of claim 2, wherein the redundancy comprises a star topology.

10. The chassis of claim 2, wherein the redundancy comprises a bused topology.

11. A chassis for receiving circuit modules and connector modules, comprising:
    a primary interconnect board;
    a plurality of first connectors affixed to the primary interconnect board;
    a plurality of second connectors affixed to the primary Interconnect board, each second connector having a one-to-one relationship with a corresponding first connector, whereby a circuit module mounted in a first connector is mateable in a substantially co-planar fashion with a connector module mounted in the corresponding second connector, whereby the connector module and the circuit module are independently removable from the chassis; and
    means for redundancy.

12. The chassis of claim 11, the primary interconnect board permitting a first keying means affixed to a circuit module to be mateable with a second keying means affixed to a connector module.

13. The chassis of claim 11, further comprising means for permitting a circuit module to be hot swappable.

14. The chassis of claim 11, wherein a circuit module is replaceable without disconnecting cables which are connected to the corresponding connector module.

15. The chassis of claim 11, the means for redundancy comprising:
- a first spare connector affixed to the primary interconnect board for receiving a spare circuit module;
- a second spare connector affixed to the primary interconnect board for receiving a spare connector module, the spare connector module being mateable with the spare circuit module;
- means for routing an I/O signal from at least one connector module mounted in a second connector to the first spare connector module; and
- means operable to automatically couple an I/O signal from a faulty circuit module through the first spare connector module to the spare circuit module.

16. The chassis of claim 15, the means for routing comprising a secondary interconnect board for interconnecting I/O signals between at least one connector module and the first spare connector.

17. The chassis of claim 15, the means for routing comprising a plurality of stacking connectors, for interconnecting a connector module with an adjacent connector module.

18. The chassis of claim 15, wherein the means for redundancy comprises a star topology.

19. The chassis of claim 15, wherein the means for redundancy comprises a bused topology.

20. The chassis of claim 11, wherein the primary interconnect board comprises a mid-plane board.

21. The chassis of claim 20, the primary interconnect board permitting a first keying mechanism affixed to a circuit module mounted in a first connector to be mateable with a second keying mechanism affixed to a connector module mounted in a second connector.

22. The chassis of claim 11, wherein the primary interconnect board comprises a side-plane board.

* * * * *